United States Patent [19]

Flinchbaugh et al.

[11] Patent Number: 4,861,419
[45] Date of Patent: Aug. 29, 1989

[54] APPARATUS AND METHOD FOR PRODUCTION PROCESS DIAGNOSIS USING DYNAMIC TIME WARPING

[75] Inventors: Bruce E. Flinchbaugh; Steven B. Dolins, both of Dallas; Aditya Srivastave, Richardson; Jon Reese, Waxahachie, all of Tex.

[73] Assignee: Texas Instruments Incorporated, Dallas, Tex.

[21] Appl. No.: 233,878

[22] Filed: Aug. 15, 1988

Related U.S. Application Data

[63] Continuation of Ser. No. 117,002, Nov. 4, 1987, abandoned, which is a continuation-in-part of Ser. No. 81,494, Aug. 4, 1987, abandoned.

[51] Int. Cl.$^4$ .................... H01L 21/306; B44C 1/22; C03C 15/00; C03C 25/06
[52] U.S. Cl. .................... 156/626; 156/643; 156/646; 156/345; 204/192.33; 204/298
[58] Field of Search .............. 156/626, 627, 643, 646, 156/662, 345; 204/192.33, 298; 437/8; 118/712

[56] References Cited

U.S. PATENT DOCUMENTS

| 4,493,745 | 1/1985 | Chen et al. | 156/626 |
| 4,615,761 | 10/1986 | Tada et al. | 156/626 |
| 4,657,620 | 4/1987 | Davis et al. | 156/345 |

Primary Examiner—William A. Powell
Attorney, Agent, or Firm—Melvin P. Sharp; James T. Comfort; Lawrence J. Bassuk

[57] ABSTRACT

Operations of a plasma etch reactor (10) are monitored to detect aberrations in etching operations. A reference end point trace is defined (62) for the etch process. Regions are defined in the reference end point trace (70) with aid of a dynamic time warping matching function (84) and characteristics and tolerances for each region are defined (72–80). The etcher is run and an actual end point trace is obtained (82) from the running of the etcher. A warping function is constructed (88) between the actual trace and the reference trace. In building the warping function, candidate path segments (100) are constructed according to a minimum cumulative cost function (96). Once the regions of the reference trace and the actual trace has been matched according to an optimum dynamic time warping function path (106), characteristics of the matched regions are compared (66) to determine whether aberrations have occurred during the etch process. In an alternative embodiment, the actual trace (164) is matched to each of a library of reference traces (162,182) by dynamic time warping (166). By determining the best match, a determination can be made whether the actual trace is abnormal (174) or normal (176), and the type of abnormality.

65 Claims, 6 Drawing Sheets

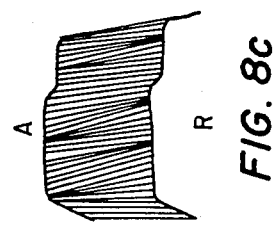
FIG. 8c
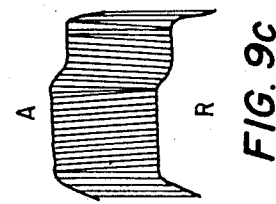
FIG. 9c
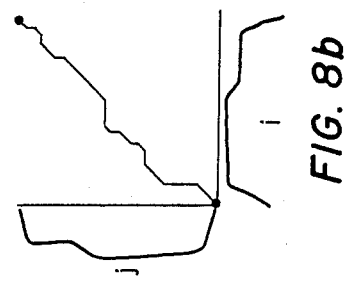
FIG. 8b
FIG. 9b
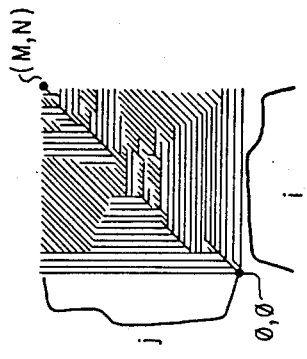
FIG. 8a
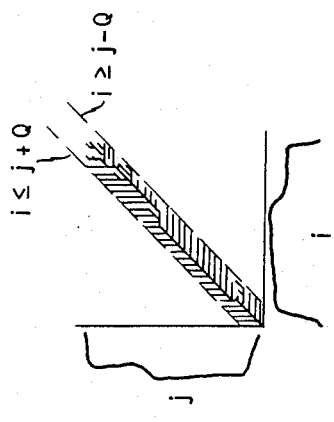
FIG. 9a

APPARATUS AND METHOD FOR PRODUCTION PROCESS DIAGNOSIS USING DYNAMIC TIME WARPING

RELATED APPLICATIONS

This application is a continuation of application Ser. No. 117,002 filed 11/4/87, abandoned, which is a continuation-in-part of application Ser. No. 07/081,494, filed Aug. 4, 1987, now abandoned.

FIELD OF THE INVENTION

The present invention relates to the field of automated quality control and process operations, and more particularly to methods and apparatus for detecting aberrations in production process operations.

BACKGROUND OF THE INVENTION

The manufacture of semiconductor devices comprises the composite of numerous processing steps on each semiconductor device. A variety of attempts have been made to establish quality control checks on the various processes during the manufacture of the semiconductor devices. The systems for these quality control checks usually include some manner of physically inspecting or testing selected specimens of the semiconductor devices at various stages during the manufacturing processes. However, such systems are often cumbersome, relatively costly, and since they are conducted, in many cases, only on randomly selected devices from the manufacturing processes, cannot guarantee the quality of each of the devices manufactured. Moreover, the previously developed systems serve to detect problems in the manufacturing process at points in time after the errors have already been made. As a consequence, the same error may have been repeatedly made during a particular processing operation on a large number of semiconductor devices before the error is detected at a later quality control inspection. It is clearly of economic interest to the manufacturing concern to detect aberrations in the manufacturing processes as early as possible after those aberrations occur. It is even more preferable to be able to detect those aberrations in real time, in other words, at the point in time at which they are occurring. Such instantaneous detection can be used to avoid duplication of the same process aberration to repeated semiconductor devices during manufacture.

A common processing operation in the production of semiconductor devices is a plasma etch. In the plasma etch, a semiconductor device in a form commonly termed a slice is positioned in an etching chamber in the presence of specified gases, at predetermined pressures and temperatures, and an RF power source is applied. In the etch, particular materials on the surface of the semiconductor slice react with gases in the chamber and then volatilize from the surface of the slice. A typical etch process for a slice can proceed for less than one minute up to or over several minutes.

Conventional etch reactors typically include apparatus to monitor particular aspects of the etching process. The reactors include apparatus to provide on-line hardware monitoring, e.g. to monitor the temperature and pressure of the reactor, the wattage of the RF power source, and the flow of feed gases. Prior art etching equipment also includes apparatus designed to detect the end point of the etching operation. *Methods of End Point Detection for Plasma Etching*; Paul J. Marcoux and Pang Dow Foo, Solid State Technology, April 1981, pp. 115-122, incorporated herein by reference, describes several methods proposed for such apparatus. Such proposed methods include methods of emission spectroscopy, optical reflection, mass spectroscopy, impedance monitoring, Langmuir probe monitoring and pressure monitoring. The end point monitoring apparatus, with whatever monitoring method is used, serves to detect the end of the desired etch reaction so that the etcher can be instructed to terminate its etch cycle and ready itself to etch a fresh slice.

A frequently applied method of end point detection uses an end point trace (EPT). An end point trace is a measure, obtained by emission spectroscopy procedures, of the concentration of gases in the plasma over the surface of the slice being etched. The end point trace can be designed to monitor either reactants or products of the etch reaction. For example, by tuning the end point trace to measure those gases which are desired etch products, the monitoring apparatus can detect when those products are no longer being emitted into the plasma, thus signaling the end of the desired etch reaction. Typically, the end point detectors are designed to look for a sharp change in the concentration of the monitored species at a time into the etch process approximately when the end point is expected. The apparatus is useful in that it provides a signal to the etching equipment to proceed to end the etch cycle, remove the etched semiconductor slice, and insert a fresh semiconductor slice into the etching chamber.

The end point detectors, whether applied or merely theoretical, however, are subject to several limitations. A principal limitation is that the detectors serve only to detect the end of etching operations. Accordingly, the detectors provide no information as to whether the etch process has proceeded in an optimum fashion or whether aberrations in the process occurred.

A need has arisen for a process or apparatus which can determine whether the etching process is proceeding or has been accomplished in an optimum fashion. Such an etch monitoring system which could automatically check the etch of every slice would also overcome numerous disadvantages referred to above with regard to current semiconductor manufacture quality control systems. Moreover, it would be advantageous if a system could monitor the etch process in such a fashion as to provide information regarding whether layers formed on the semiconductor device prior to the etching operation were formed and treated in the intended manner.

The prior art devices and processes are not able to provide the above mentioned desired advantages.

In co-pending application Ser. No. 046,497, filed May 4, 1987, by Barna, et al, assigned to the assignee of the present application, and filed after the invention of the present application, is disclosed a method and apparatus for detecting aberrations in cyclically repeated process operations. A particular application of the invention described in that application is in regard to plasma etch processes in the production of semiconductor devices. In an embodiment of the invention of that application, the actual end point trace, for the etch of each semiconductor slice is compared in detail with a predetermined reference end point trace to determine not only whether the etch has proceeded as intended, but also to determine whether certain operations prior to etching have been properly carried out on the slice.

In co-pending patent application Ser. No. 07/081,494, a process and apparatus were disclosed for detecting aberrations in production process operations. In an illustrated embodiment in the parent application, operations of a plasma etch reactor were monitored to detect aberrations in etching operations. A reference end point trace was defined for the etch process. Regions of the trace were defined and characteristics and tolerances for each region were defined. The etcher was then run and an actual end point trace was obtained. This actual trace was analyzed to identify proposed regions of the actual trace, and then the proposed regions of the actual trace were matched with the regions of the reference trace. The invention of the parent application employed a series of heuristic functions in matching proposed regions of the actual end poit trace with regions of the reference trace. Characteristics of the matched regions were compared to determine whether aberrations occurred during the etch process.

A process known as dynamic time warping has been used in the speech recognition art for matching an actual speech curve to a reference speech curve. The application of dynamic time warping to speech recognition is described in Parsons, T., *Voice and Speech Processing*, McGraw-Hill, New York, 1986, pp. 297–303, 379–382. A more general treatment of dynamic programming can be found in Horwitz and S. Sahni, *Fundamentals of Computer Algorithms*, Computer Science Press, Inc., Rockville, Maryland, pp. 198–208. The principles of dynamic time warping have, however, not been heretofore applied to production process monitoring.

The present invention provides an improved method and apparatus to that disclosed in the related applications.

SUMMARY OF THE INVENTION

The present invention provides an improved process and apparatus for detecting aberrations in cyclic or repeated process operations. A particular application of the present invention is in regard to plasma etch processes in the production of semiconductor devices. In an embodiment of the present invention applied to end point trace data, the invention provides an improved analysis between actual end point trace data for the etch of a semiconductor slice and a predefined reference end point trace for the particular etch process being conducted. It has been discovered that in the practice of the present invention, analysis of the end point trace data can, in many cases, suggest probable causes of detected aberrations in the etch reaction. In some cases, the present invention can analyze the end point data to provide valuable information regarding the layers of material formed on the semiconductor device prior to the etching process.

In an embodiment of the present invention used in conjunction with the plasma etcher, the actual end point trace for the etch of each slice is compared in detail with a predetermined reference end point trace to determine not only whether the etch has proceeded as intended, but also to determine whether certain operations prior to etching have been properly carried out on the slice. For example, the present invention can analyze such situations as where a deposition is too thick or too thin, or where a photolithography step has been omitted or incorrectly conducted in that certain structures are still covered.

According to one aspect of the invention, a reference end piont trace is first defined. The reference end point trace is divided into regions, each having significance as to corresponding junctures or steps in the etching process. The regions of the reference trace are divided from one another at preselected critical points.

An actual end point trace is next obtained during the etching of each semiconductor slice. The critical points on the reference trace are matched with corresponding critical points on the actual trace using a dynamic time warping function. The actual trace is then divided at the critical points thereon to define regions that correspond to the regions of the reference trace. When each of the regions of the actual trace has been matched to a region of the reference trace, predetermined characteristics of each region are compared with corresponding characteristics of corresponding regions of the reference end point trace.

This comparison is made by executing a set of rules which have been adopted to the specificd process being monitored. These rules are termed "process specific" rules. The process specific rules call a set of rules which compare a generic set of characteristics of any two regions. These latter rules are termed process independent rules. With the comparison of the regions of the actual end point trace with the regions of the reference end point trace, the system can identify when aberrations have occurred in the etching operation. The system can also, by its detailed analysis of the regions, and the application of process specific rules, suggest probable causes for the aberrations identified.

According to a preferred embodiment of the present invention, the dynamic time warping function is generated by first matching a beginning point of the reference trace to a beginning point of the actual trace, thereby defining a beginning poit of an optimal time warping function path. In a similar manner, an end point of the reference traces is matched to an end point of the actual trace to originate an end point of the warping function path. Next, a monotonic optimal time warping function path is generated between beginning point and the end point thereof, with each point on the path consisting of a pair of pointers correlating a point on the reference trace to a point on the actual trace. The warping function path is optimized according to a minimum cost function, wherein the differences of selected characteristics of the matched points on the reference trace and those of the actual trace are minimized.

The present invention provides a system with the advantage of an improved capability to analyze and compare continuously variable data curves with continuously variable reference curves.

According to another aspect of the invention, an actual end point trace may be compared to each of a plurality of reference signal traces. These reference signal traces include at least one predefined normal reference trace that corresponds to an acceptable operaiton of the process, and also includes a plurality of predefined abnormal reference traces that each correspond to an unacceptable operation of the process. As before, an actual signal trace is generated by a detector. Then, a plurality of dynamic time warping functions are derived from comparisons of the actual signal curve to each of the reference signal curves. For each of these warping functions, a cumulative cost function is determined that is related to the dissimilarity between the respective reference curve and the actual curve. The minimum of these cost functions is ascertained, and a closest match between the actual curve and one of the reference curves is declared. The operator can then discern whether the process is within permitted operating parameters, or whether a malfunction of a predetermined type is occurring in the plasma etch reactor, such as a too-thick deposition of polysilicon.

A particular advantage of the present invention is that it can tolerate variations in the duration or the shape of the particular regions of the actual data curve and still identify the predefined regions of the actual data curve and compare them with the corresponding regions of the reference curve. This is of particular advantage since, for a variety of reasons, the duration of one or more regions of the actual data curve can vary significantly from curve to curve. To accurately analyze each actual data curve, it is crucial to first accurately identify the beginning and ending points and duration of each region of the curve.

Yet another advantage of the present invention is that it defines and compares regions of a continuously variable curve which regions of the actual data curve can not only "stretch" in duration, but which can also "float" in time. For example, if an early region of a data curve is of an overly long duration, the present invention can allow for such extended duration and still identify the boundaries of subsequent regions in the data curve.

Another advantage of the present invention is that it is modular, and so the system can be easily and quickly applied to varying etch or manufacturing operations.

Another advantage of the invention is that dynamic time warping is a relatively small program to implement, so that it is well-suited for the diagnosis of products in semiconductor manufacturing. It is believed that dynamic time warping will produce superior matches of actual traces to reference traces. Another advantage is that the dynamic time warping matching function is very simple and should be easy to maintain as embodied in computer software.

BRIEF DESCRIPTION OF THE DRAWINGS

Further aspects of the invention and their advantages will be described in the following detailed description in conjunction with accompanying drawings, in which:

FIG. 8a is a graph of a tree of candidate warping function path segments produced by dynamic time warping, showing unconstrained point matching;

FIG. 8b is a graph of the optimal time warping function path produced by the warping function diagrammed in FIG. 8a;

FIG. 8c is a three-dimensional interpretation of the matching between the points of a reference trace R to an actual trace A according to the warping function path of FIG. 8b;

FIG. 9a is graph of a tree of warping function path segments produced by dynamic time warping, where the point matching is constrained by a window function;

FIG. 9b is an optimal warping function path produced by the warping function diagrammed in FIG. 9a;

FIG. 9c is a three-dimensional interpretation of the matching of points on a reference trace R to an actual trace A according to the optimal path shown in FIG. 9b;

DETAILED DESCRIPTION OF THE INVENTION

Figure 1:
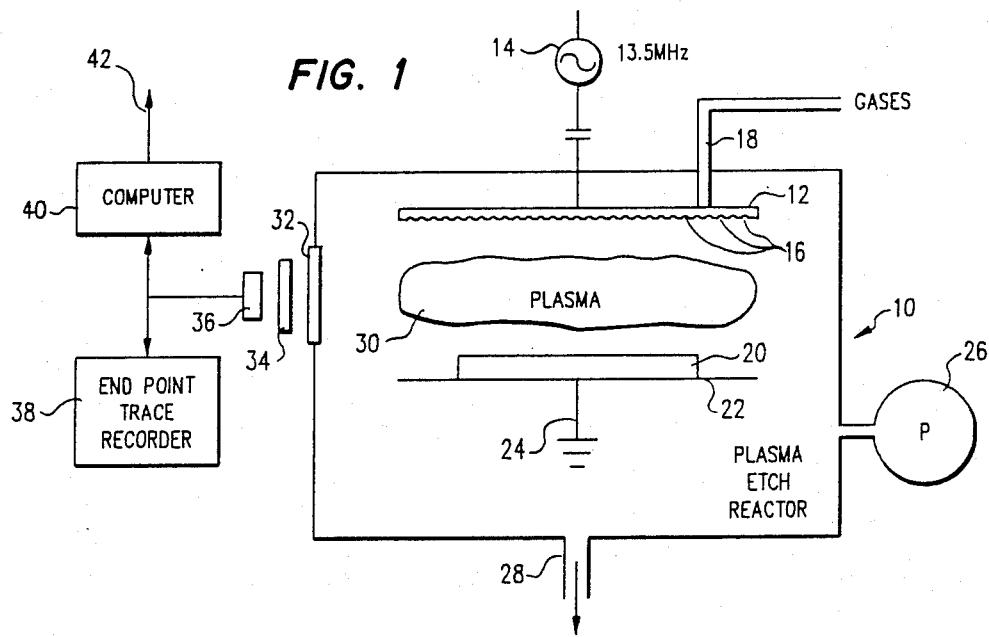
FIG. 1 shows a diagrammatic view of a typical plasma etch reactor including an end point trace monitoring apparatus and a computer means according to an embodiment of the present invention.

As pionted out above, the present invention provides an improved process and apparatus for detecting aberrations in repetitive-type process operations. The present invention has application for such repetitive process operations which can be monitored by a device to provide a continually variable electrical signal or signature which correlates to the progress of the process being monitored. One type of such continually variable electrical signal used in the present invention is time based, meaning that it varies over time. Also, the signal can be one of intensity which varies over time. Such signals frequently can be broken down into regions which correspond to portions or steps of the process being carried out. It is also important that the signal be one for which a preferred or reference signal can be defined, wherein the reference signal represents the signal expected when the process proceeds in the preferred fashion. Accordingly, the actual signal received during operation of the process can be matched against the characteristic signature of the reference signal.

In the present invention, a reference curve is defined which corresponds to the expected appropriate variable signal for whatever sensing device is monitoring the process. During the operation of the process, an actual curve is obtained representing the output of the sensing device. Either during the processing cycle or afterwards, the regions of the actual curve are matched against corresponding regions of the reference curve to determine whether the actual curve suggests that the process is proceeding or has proceeded in the preferred fashion or whether the actual curve suggests that aberrations have occurred in the process cycle. The specific characteristics of each region of the actual curve, which are compared with those of the reference curve, can vary from region to region and are determined by process and data considerations for the particular process steps to which those regions correspond.

Results of the comparison of actual and reference curves can be used in a variety of ways, including signaling the processing equipment to continue operations, signaling the processing equipment to halt operations, signaling the operator of the processing equipment, storing information for the particular process cycle for later use, signaling processing equipment to alter the process, either during the process or in a later process cycle, or analyzing the data to point out a particular aberration or the cause of the aberration detected.

One co-pending patent application, Ser. No. 046,497, discloses a method and apparatus for detecting aberrations in cyclically repeated process operations. The co-pending application describes a system in which a reference curve as well as regions in the reference curve are defined for a particular process. Further, an actual curve representing data from the process is obtained during the process and compared with the reference curve to determine whether aberrations have or are occurring in the process being monitored. The co-pending application describes use of the system in conjunction with plasma etch during operations. In the system described in this co-pending application, during analysis of the actual curve the regions of the actual curve are defined as a function of time from the beginning of the process operation.

The present invention provides an improved process and apparatus for the comparison of reference and actual continuously variable curves. The present invention comprises an improved method of identifying the regions in the actual curve, with the result that the regions are more accurately defined and consequent analysis resulting more accurate. The present invention also provides an improved method using a dynamic time warping algorithm to match critical points on a reference curve to critical points on an actual curve. This again also results in a more accurate definition of the regions of and analysis of the actual curve. The present invention also is modular and uses sets of process independent rules as well as sets of process specific rules in its analysis. Consequently, the system of the present invention is particularly well suited for easy adaptation to different and varying etch processes or other production processes.

An embodiment of the present invention has found particular application in conjunction with semiconductor manufacturing processes, particularly with plasma etch processes. Described in conjunction with FIGS. 1 through 15 below are embodiments of the present invention adapted for application to plasma etching operations.

Shown in FIG. 1 is a diagrammatic view of a typical plasma etch reactor in conjunction with an embodiment of the present invention. The plasma etch reactor includes a plasma etch reactor vessel 10 in which is mounted a shower head electrode 12. The shower head electrode is capacitively coupled to an RF power source 14 which typically provides power at 13.5 megaHertz. The RF power source 14 has an RF tuning network not shown in FIG. 1. The electrode 12 has holes 16 therein from which are emitted gases which are fed to the electrode 12 by way of a gas line 18. The flow of the gases is controlled by a mass flow controller not shown in FIG. 1. A semiconductor slice 20 being etched is mounted on a substrate 22 of the reactor which is grounded as shown at 24. The reactor includes a pressure regulator 26 and a gas exit line 28, which is operatively connected to a vacuum system not shown in FIG. 1.

In the operation of the plasma etch reactor, a mixture of gases is fed through electrode 12 while power is supplied to the electrode from the RF source 14. A low pressure glow discharge is established to produce a reactive species in a plasma 30. The reactive species selectively react with a thin film of materials on the slice 20 to form a product which volatilizes from the slice 20 and is eventually pumped out of the reactor through gas exit line 28. The etching operation is conducted until, in a successful etch, a predetermined amount or depth of the desired material is etched away from the surface of slice 20.

The end point trace from the etch reactor shown in FIG. 1, is obtained by methods of emission spectroscopy. The end point trace sensing apparatus is able to detect the light emitted by electronically excited species in the plasma. Although the light emitted by an atom, molecule or free radical in a non-equilibrium plasma is not strictly proportional to the concentration of that species, for purposes of the end point trace the propotionality can be assumed to hold. The sensing apparatus can be set to monitor the concentrations of either etch reaction products or reactive species in the plasma. Once a determination is made as to which the product or species is to be detected, the system is set to monitor the wavelengths of light corresponding to those emitted by the species to be monitored. In the embodiment described herein, the system is designed to detect the light emitted by particular etch products.

FIG. 1 also shows an apparatus for obtaining the end point trace for the processes of the etcher. The plasma etch reactor vessel 10 includes a window 32 through which passes light emitted from the plasma. Light from the window passes to an optical filter 34 which blocks light except at preselected emission bands. In the embodiment described, the apparatus is set to monitor carbon monoxide and so filter 34 is selected to pass light in a band of about 520 nanometers. Light emitted from the plasma 30 passes through window 32 and, if of the appropriate wavelength, passes through optical filter 34 to a photodiode 36. An electrical signal corresponding to the intensity of light impacting on photodiode 36 is generated by photodiode 36 and is communicated to an end point trace recorder 38. In a typical prior art plasma etch reactor, the end point trace recorder 38 provides a paper strip-chart record of the end point trace of the etching operation conducted in the reactor.

One of the desired reactions in the embodiment described is the etching of silicon dioxide with $CF_4$:

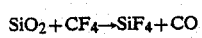

$$SiO_2 + CF_4 \rightarrow SiF_4 + CO$$

The formation of CO, and hence its spectral intensity in the plasma, decreases when all the $SiO_2$ is etched off the slice, and the above reaction ceases to produce more CO. Thus, a decrease in the CO line intensity, at times when this end point is anticipated, is an indication that the layer has been etched off (i.e. that the end point has been reached).

Also shown in FIG. 1 is a digital processor or computer 40 operably connected to photodiode 36 to receive the output signal or photodiode 36. Computer 40 functions in the embodiment of the present invention, among other things, to store programs and subroutines for the system, to store the reference end point trace or traces and other data, and to analyze the actual end point trace, to compare the reference end point trace with the actual end point trace and match the actual trace to one or more reference traces using dynamic time warping (to be later described), to store information regarding comparisons of the reference end point trace with the actual end point trace including cumulative warping costs, and provide certain signals or controls to the plasma etcher or the operator of the equipment as well as other functions as desired. An output 42 from computer 40 provides signals to either the plasma etch reactor, control equipment for the plasma etch reactor, to an operator, to signal means or other means as desired. Computer 40 is programmed to conduct the comparisons of end point traces as well as other functions outlined below and may comprise a stand alone computer or may comprise a part of the computer control systems for the plasma etch reactor if such computer control system have sufficient capability to carry out the functions described below. In one embodiment of the present invention, computer 40 comprises a Texas Instruments Explorer computer with software written in LISP. The software is designed such that an end point trace of any shape can be analyzed and compared with one or more reference end point traces for the etching process.

Figure 2:
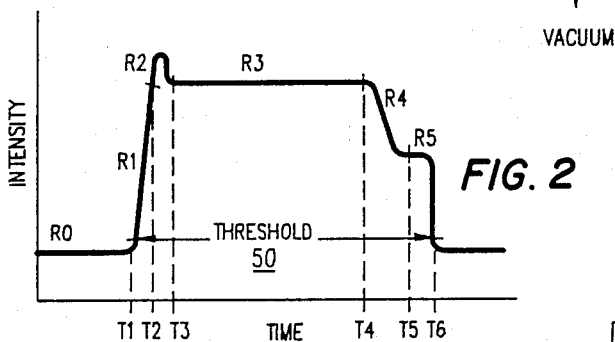
FIG. 2 shows a representation of a reference end point trace for a particular etch process for an embodiment of the present invention.

FIG. 2 shows a simulated reference end point trace for a particular etch process through one layer of oxide material on a semiconductor slice in an embodiment of the present invention. In FIG. 2, intensity is plotted as a function of time. The intensity corresponds to the voltage intensity of the signal generated by photodiode 36 in FIG. 1. As stated previously, the end point trace apparatus has been preset to monitor carbon monoxide etch reaction products volatilized into the plasma. The end point trace of FIG. 2 simulates a signal from photodiode 36 from a point in time prior to when the etch reaction is initiated, through several steps encountered during the plasma etch, and, finally, through the end of the plasma etch process. Accordingly, then, in FIG. 2, prior to T1 in region R0, the signal from photodiode 36 is below the threshold value 50 indicating the lack of a plasma of excited species. This indicates that the plasma etch reaction has not yet begun. At time T1, the plasma etch reaction has begun as the end point trace intensity rises above the threshold level 50. The intensity of the end point trace increases sharply from T1 to T2 in the region denoted R1, thus indicating the presence of a plasma of excited species and a sharp rise in the concentration in the plasma of the monitored species.

R1 corresponds to a particular phase of the etching operation, as do each of the otehr regions R2 through R5 of the end pot trace. For example, R2 represents a transition point from the start-up phase R1 to the relatively stable phase R3 during which a predetermined amount of oxide material is etched from the surface of the slice and where the concentration of monitored species in the plasma remains approximately constant. Region R4 indicates a drop-off in the concentration of the carbon monoxide species being monitored in the plasma, and suggests that the oxide material or layer being etched during R3 has been exhausted. The plateau of R5 corresponds to the outboard signal from the plasma itself with little or no carbon monoxide present in it. Since the intensity is relatively constant during the plateau region of R5, this indicates that little or none of the monitored species is being produced.

The etching operation is continued for a predetermined period of time after the end point of the oxide etch as shown in R4 so as to insure a complete clearing of oxide material from areas of the slice being etched. After the predetermined period of time, the etching operation is terminated and the plasma is no longer generated. This is shown in the steep drop-off of intensity in the latter part of R5. At T6 the signal drops below the threshold value since no plasma of an excited species is present.

Figure 15:
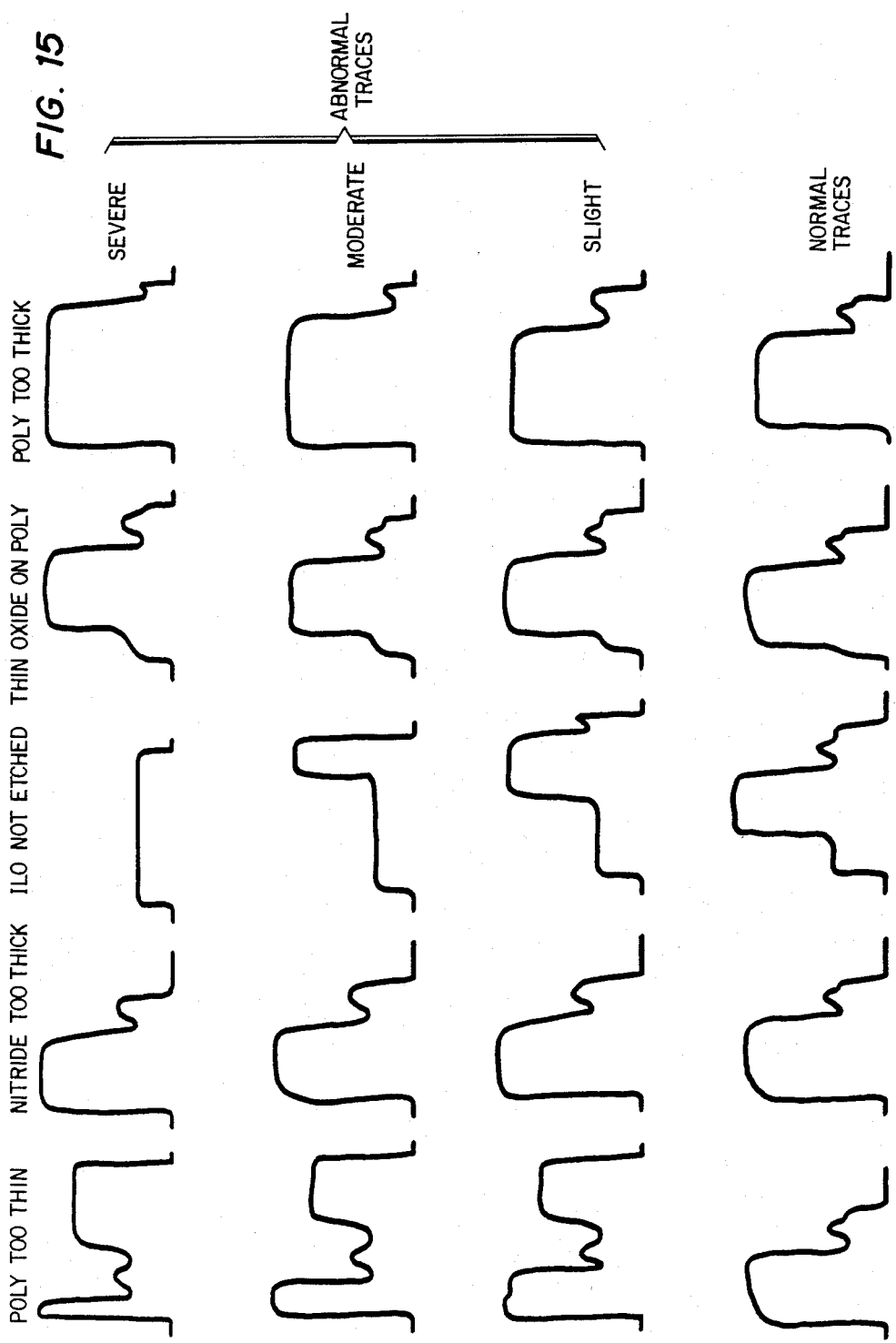
FIG. 15 illustrates a family of reference end point traces to whcih an actual end point trace is directly compared by dynamic time warping according to an alternative embodiment of the invention.

It should be noted that the etching operation can also be designed to proceed through two or more layers of different materials. In such cases, the reference end point trace would probably vary from that of FIG. 2 and would include regions corresponding to the various layers and materials being etched. Examples of such end point traces are shown in FIG. 15 which shows a family of traces corresponding to an etch through several different materials, including polysilicon, nitox, silicon nitride and silicon dioxide.

Figure 3:
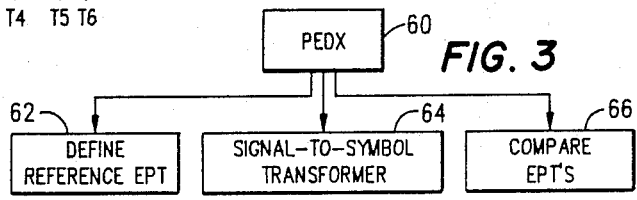
FIG. 3 shows an overview structure chart of the software for an embodiment of the present invention.
Figure 4:
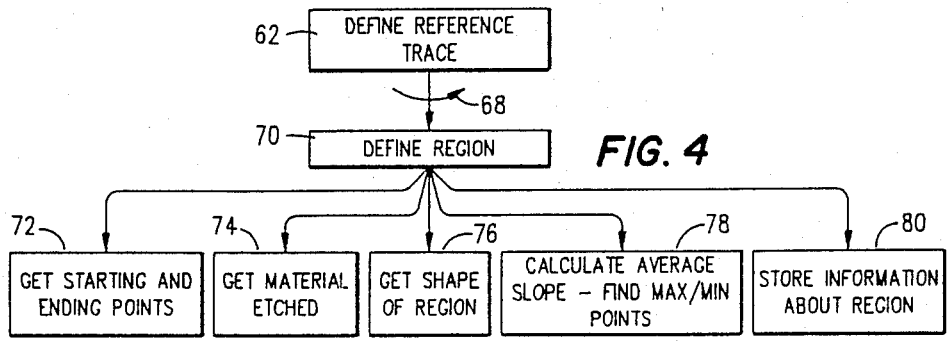
FIG. 4 is a structure chart, according to the embodiment of FIG. 3, showing the general function of defining the reference trace.
Figure 5:
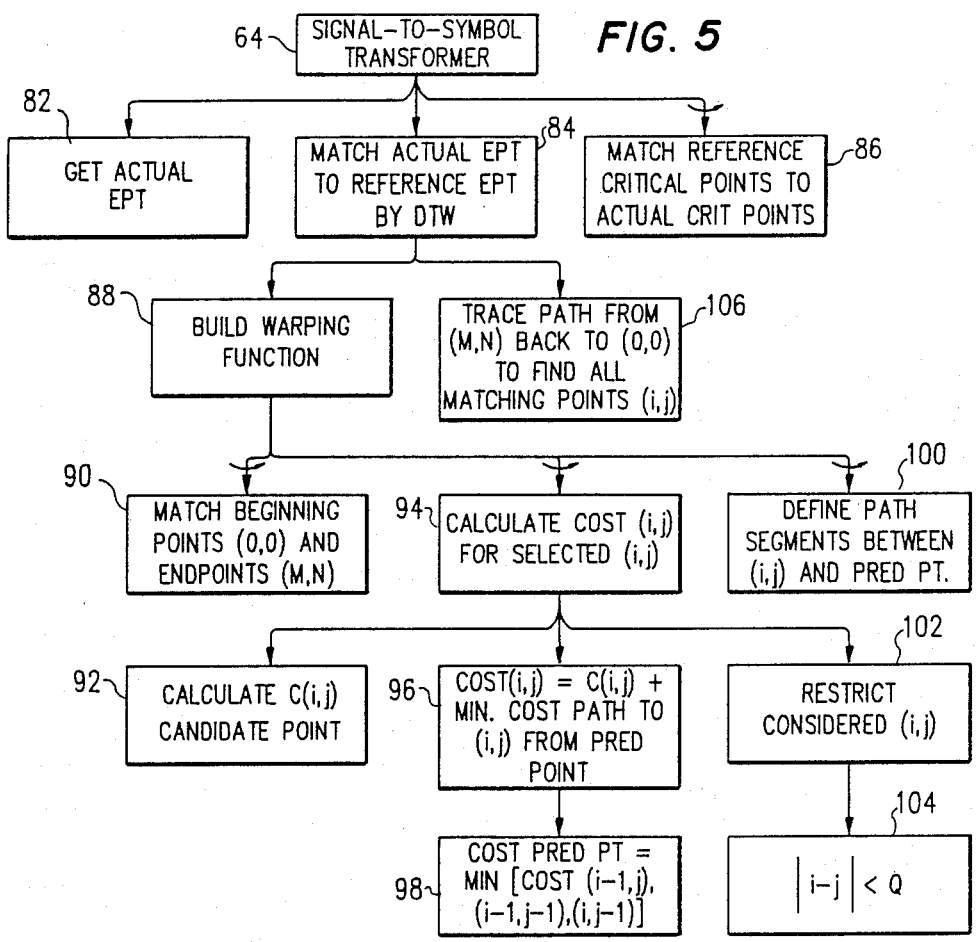
FIG. 5 is a structure chart showing the functions of acquiring critical points on an actual end point trace through dynamic time warping.

FIGS. 3 through 5 are structure charts illustrating the functional architecture of the software program for controlling computer 40 to accomplish one embodiment of the present invention.

FIG. 3 shows an overview structure chart for the function of an embodiment of the present invention designed to monitor plasma etching operations. The embodiment illustrated in FIG. 3 is termed a plasma etch diagnosis expert system or "PEDX". The structure chart of FIG. 3 illustrates the functions of various parts of the system. Module 60 represents the PEDX system.

The overview structure chart of FIG. 3 shows the system illustrated in three general function modules. The first general function module is shown at 62 and comprises defining the normal trace or end point trace. A structure chart illustrating in detail the specific various functions of general module 62 is shown in FIG. 4 below. The second general function of the PEDX system 60 is that of the signal to symbol transformer represented by module 64. Various functions of module 64 are illustrated and discussed more fully in conjunction with FIG. 5 below. The third general function module of the PEDX system 60 is to compare the actual end point trace with the reference end point trace as illustrated by module 66. The function of module 66 is discussed more fully in conjunction with FIG. 6 below.

FIG. 4 is a structure chart for the functions of module 62 of FIG. 3. Module 62 represents the general function of defining the reference trace for the embodiment of the present invention. As shown in FIG. 4, the general function of defining the reference trace comprises multiple steps of defining regions in the trace. The function of defining a region is shown in module 70. The arrow 68 indicates that function 70 is carried out several times, e.g., for each region of the trace, and is similar to a loop in a computer program flowchart. Function 70 serves to define an object to describe each region in the reference end point trace. The function of defining each region of the trace 70 comprises getting the starting and ending points, including their respective times, of the region at block 72, getting or identifying the material etched during the region at block 74, getting the shape of the region at block 76, calculating an average slope and finding the maximum and minimum points of the region at 78, and writing the information about the region to program files at 80.

Functions 70-80 are carried out for each region of the reference trace. The characteristics shown in FIG. 4 for each region may be defined by an operator knowledgeable of the significance of regions and their characteristics.

FIG. 5 shows a structure chart for the operation of the system in carrying out the general function 64, shown in FIG. 3, of the signal-to-symbol transformer.

The three principal functions of module 64 are acquiring the actual end point trace at 82; matching the actual end point trace to a reference end point trace by dynamic time warping, as shown at 84; and matching the predetermined reference critical points to the corresponding points on the actual trace to derive the critical points thereon, as shown at 86.

The matching of the actual end point trace to a reference end point trace by dynamic time warping requires the construction of a dynamic time warping function, as shown at block 88. A dynamic time warping function matches each of a plurality of points i on a reference trace to each of a plurality of selected points j on an actual trace. For an unrestricted warping function, each point i on a reference trace is matched to each point j on the actual trace. The point i on the actual trace has an intensity and is located at a particular time $t_1$ on the reference curve. Likewise, a point j on the actual curve is associated with a particular intensity at the same or another time $t_2$ on the actual curve. Points i on the reference curve are separated by equal increments of time, as are points j on the actual curve.

In FIG. 8a, an unrestricted, completely developed dynamic time warping function is shown. A reference curve i has been plotted against an actual curve j for each point (i,j) throughout a dynamic time warping matrix. The plurality of lines each indicate a minimum cumulative cost path from a beginning point of the dynamic time warping function to each particular point (i,j). The cumulative cost function will be described presently below.

In general, the cumulative cost function is a measure of the dissimilarity of the actual curve with respect to the reference curve. For an exact correspondence, the cumulative cost function for any point (i,j), and the curves up to those compared points, will be zero. As the intensity or slope for any taken point i on the reference curve deviates away from the taken point j on the actual curve, the cost function will typically increase. Thus, it is desirable to find the minimum of the cost functions associated with various of the points (i,j).

The various modules concerned with building the dynamic time warping function are illustrated in the blocks below module 88 in FIG. 5. First, at module 90, a beginning point (O,O) of the reference trace is met with a beginning point (O,O) with the actual trace. Likewise, an end point (M,O) on the end of the reference end point trace is matched with an end point (N,O) of the actual trace. It is assumed for the purposes of illustration that the intensities of the beginning and end points for both the reference trace and the actual trace are zero. This need not necessarily be the case.

Referring once again briefly to FIG. 8a, a beginning point (O,O) of the dynamic time warping function and an end point (M,N) are identified on the graph. The task next becomes to build a tree of candidate path segments that connect each point (i,j) in the dynamic time warping matrix to the beginning point (O,O). Once this tree of path segments is completed, a particular path will connect the end point (M,N) with the beginning point (O,O).

Returning to FIG. 5, a cumulative cost function COST is calculated for each selected point (i,j) in the dynamic time warping matrix at 92. The cumulative cost function at any point (i,j) in the warping matrix is the sum of the incremental cost for that point, plus the cumulative cost associated with a selected predecessor point. The predecessor point is selected such that the sum of the cumulative cost at that predecessor point plus the incremental cost of the candidate point is at a minimum.

Figure 6:
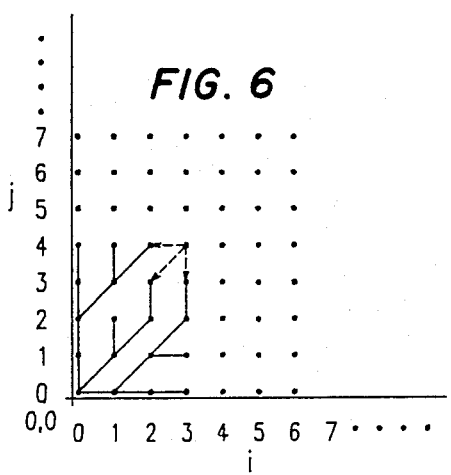
FIG. 6 is a graph showing a stage during the assembly of a time warping function between a reference trace and an actual trace.

The process of assembling the tree of candidate path segments is illustrated by the simplified schematic diagram shown in FIG. 6, which shows the first few stages of such a tree. Each point (i,j) is represented by a dot in the matrix. The beginning point is (O,O). A tree of candidate path segments has been built up through several stages in the assembly process until point (3,4) has been reached and is now considered. Point (3,4) is the point in the warping function matrix that correlates a point (r,3) in a reference curve R to a point (a,4) of an actual curve A, where r and a are the intensities at those points.

Point (3,4) in the warping function matrix is a member of a stage k. The relationship between this point and each point in a previous stage k−1 that is adjacent the considered point is inspected. The points in stage k−1 meeting the adjacency criterion are point (2,4), point (2,3), and point (3,3). These three points constitute all of the candidate precedessor points for the candidate point (3,4).

For the taken point, an incremental cost function c(i,j) is calculated, as is shown in FIG. 5 at block 94. The incremental cost function for matching a point on the reference curve to a selected point on the actual curve can be based on anyone of several differences in the shape and value of these curves. One such incremental cost function can be related to the square of the difference in the voltages (or other intensities) at the compared ponts, as is shown below:

$$c(i,j) = (V_{ri} - V_{aj})^2 \qquad (1)$$

$V_{ri}$ is the voltage intensity at time i of reference curve R, while $V_{aj}$ is the voltage intensity on actual trace A taken at time j.

Figure 7:
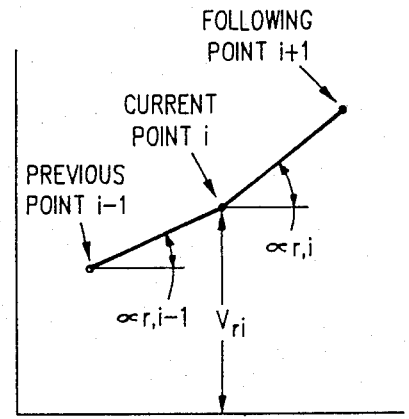
FIG. 7 is a diagram showing the parameters of an incremental cost function associated with matching a selected point on a reference trace to a selected point on the actual trace.

FIG. 7 illustrates angular and voltage parameters that may be used in calculating the incremental cost function. As noted bove, a voltage $V_{ri}$ is measured on reference curve R for a current point i. This may be compared against a like voltage $V_{aj}$ on actual curve A, taken at a point j thereon.

The cost function preferably also is related to the difference of the slope at the compared points. In order to calculate this, an angle $\alpha_{r,i-1}$ may be measured between a previous point i−1 and a current point i, and a second angle $\alpha_{r,i}$ may be measured between the current point i and the following point i+1. Similar angles are measured on the actual curve at points j−1 and j. As depending on angular measurements, the incremental cost may be calculated as:

$$c(i,j) = (\alpha_{r,i-1} - \alpha_{r,i})^2 + (\alpha_{a,j-1} - \alpha_{a,j})^2 \qquad (2)$$

where $\alpha_{r,i-1}$ is the angle of slope from the previous point $i-1$ to the reference point $i$ with respect to horizontal; $\alpha_{r,i}$ is the angle from the current reference point $i$ to the next reference point $i+1$, $\alpha_{a,j-1}$ is the angle between a preceding actual point $j-1$ and a current actual point $j$, and angle $\alpha_{a,j}$ is the angle from the current actual point $j$ to the next actual point $j+1$.

In practice, it has been discovered that the best matching is obtained by using an incremental cost function that is a function of both the difference in voltages and the difference in change of curve angle:

$$c(i,j) = (\alpha_{r,i-1} - \alpha_{r,i})^2 + (\alpha_{a,j-1} - \alpha_{a,j})^2 + m(\alpha_{ri} - \alpha_{aj})^2 \quad (3)$$

where the variables of equation 3 are as identified above, with m being a weighting factor. For a particular application of etching a second layer of polysilicon on a semiconductor substrate, a good match has obtained where m is chosen to be 0.25. Thus, for this particular application, the incremental cost function is determined primarily by the differences in curve angles at the compared points, and secondarily by differences in voltage intensity.

Once the incremental cost for the taken point is calculated at block 94 (FIG. 5), this incremental cost may be used to calculate the cumulative cost for the taken point as shown at block 96. As shown at block 98, the used cumulative cost is selected as the minimum of the cumulative costs associated with the candidate predecessor points. In the preferred embodiment, the candidate predecessor points are limited to the points at $(i-1,j)$ $(i-1,j-1)$ and $(i,j-1)$, as previously explained. In other embodiment, points other than the ones immediately adjacent the candidate point may be considered.

At block 98, the minimum of the cumulative costs associated with the candidate predecessor points is determined. The predecessor point for the candidate point is then defined as the same as that candidate predecessor point that was associated with the minimum cumulative cost. At block 96, the minimum cumulative cost COST-$(i,j)$ will then be calculated as equal to the incremental cost $c(i,j)$ plus the value of COST associated with the selected predecessor point.

Once the cumulative cost for the taken point and the identity of the predecessor point have been determined at block 96, a path segment between the taken point and the predecessor point may be constructed at block 100.

The module indicated at block 92 and its subsidiary blocks is repeated for each point $(i,j)$ in the current stage k, and the steps of calculating the cumulative costs and defining the path segments are repeated for subsequent stages k+n in the time warping function matrix. In this way, a tree of candidate path segments is constructed, as is shown in FIG. 8a.

In a preferred embodiment, the selection of taken points $(i,j)$ in each stage k is constrained, as is shown in FIG. 5 at block 102. One way of constraining the taken points is by limiting the amount of time warp that is possible between a reference point r,i and an actual point a,j. A particularly preferred constraint is shown at block 104, which limits the considered points $(i,j)$ to those that fit the equation:

$$|i-j| - Q \quad (4)$$

Q is a constant. A warping function matrix wherein the considered points $(i,j)$ are constrained by this window function is illustrated by FIG. 9a.

Returning to FIG. 5, once the warping function has been constructed at block 88, including a connection to end point (M,N), the path is monotonically back-traced from the end point (M,N) to the beginning point (O,O) through the path segments that connect these two points, as is shown at step 106. Since each path segment represents the path from a current point $(i,j)$ to the predecessor point yielding the smallest cumulative cost, the entire path from end point (M,N) to point (O,O) using these path segments will yield the optimum time warping function path that matches the reference curve R to the actual curve A. Such optimum paths are shown, for unconstrained matching, by FIG. 8b, and for constrained matching, by FIG. 9b.

The resultant warping functions are three-dimensionally illustrated by FIGS. 8c and 9c. In FIG. 8c, a three-dimensional depiction of the warping function is shown in the case of unconstrained matching. In FIG. 9c, a three-dimensional view of the warping function is shown for the case where the allowed time warp is constrained. It appears that a better match is obtained in the illustrated embodiment by using a constrained match, as is shown in FIG. 9c. This is because there are a minimum of single points i that are matched to a multiplicity of points j, and vice versa. The multiply-matched points are increased if the matching is allowed to be unconstrained, as is shown in FIG. 8c.

Once the entire reference trace R has been matched to the actual trace A, the critical points on the actual trace A can easily be ascertained at block 86, as these have been previously defined for the reference trace R.

In overview, the matching function matches regions of the actual end point trace to regions of the reference end point trace from left to right.

Figure 10:
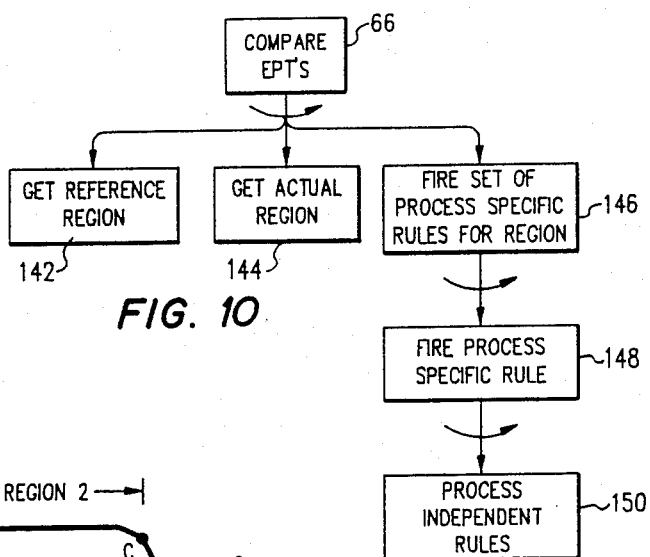
FIG. 10 is a structure chart, according to the embodiment of FIG. 3, illustrating the function of comparing the end point traces.

FIG. 10 is a structure chart illustrating the tasks of the program in accomplishing the functions shown in module 66 of FIG. 3, that of comparing the end point traces. As shown in FIG. 10, this function includes, for each region, getting the reference region 142, getting the actual region 144, and then applying a set of process-specific rules for the region at 146. As pointed out previously, the process-specific rules are set out to analyze with particularity, each of the separate regions of the actual end point trace, and may include different sets of comparisons and analysis for different regions. The step of applying the sets of process-specific rules for the region 146, includes also firing the process specific rules 148 as well as the process independent rules 150.

Figure 11:
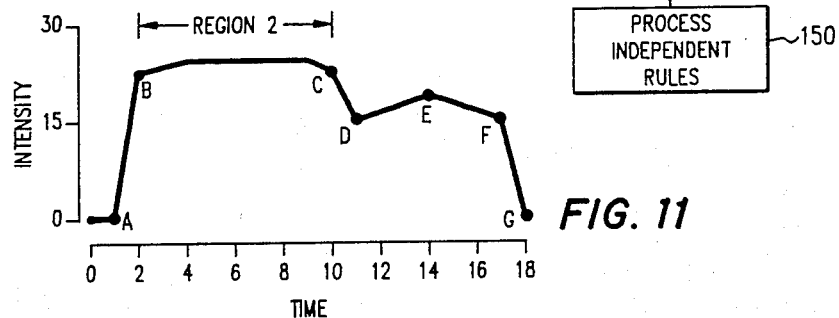
FIG. 11 shows an example of a reference end point trace with intensity plotted as a function of time.
Figure 12:
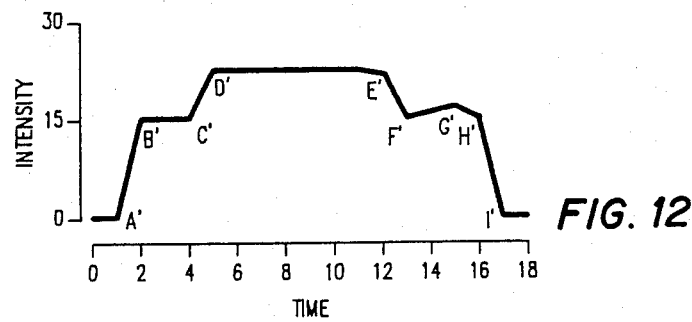
FIG. 12 shows an example of a first actual end point trace to be matched against the reference end point trace of FIG. 11.
Figure 13:
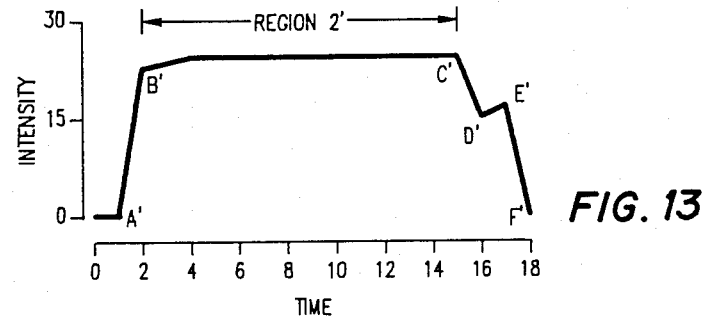
FIG. 13 shows an example of a second actual end point trace to be matched against the reference end point trace of FIG. 11.

The examples shown in FIGS. 11-13 show the capability of the system to match, using dynamic time warping, regions of the actual end point trace against regions of the reference end point trace, even when unexpected data patterns occur in the actual end point trace. The present invention uses rules to operate on the output of the signal to symbol transformer, e. g. module 64 of FIG. 3, to detect and diagnose problems with the etch. The system consists of two sets of rules, process independent rules and process specific rules.

Process independent rules compare the regions of the actual trace to the matched regions of the reference trace and look for abnormalities. These rules apply to any plasma etch process, comparing the intensities, slopes and times of critical points in the reference and actual end point traces. The conclusions of the process independent rules are symbolic, for example, the result of the rule that compares the times of two critical points may be "too early", "too late" or "no problem". The process independent rules also look for other abnormalities or irregularities in the regions such as positive or negative peaks, multiple peaks, or other abnormalities.

Process specific rules identify the cause of the problem. The rules are divided into groups; each group represents knowledge about a different region. Process specific rules are developed by process engineers which have experienced working with the particular process, and are familiar with the variety of possible problems and the shapes of the corresponding end point traces. The process engineer writes rules for handling symptoms by identifying the appropriate process independent rule, and associating a cause, or more than one cause, with each problem. The process independent rules also call or fire sets of process independent rules in comparing, or in some regards analyzing, the regions of the traces. The process specific rules then proceed from using the findings from the process independent rules.

In analyzing the actual end point trace of FIG. 11b, the system would compare each of the regions of FIG. 8 with the regions of FIG. 11. In the comparison, the rules will ignore cases where the regions are almost identical and will detect cases where there are significant differences in the regions. In the case of the region from point A' to D' of FIG. 12, the process independent rule comparing times of critical points will note that the ending time for the last critical point D' is "too late" when compared with the time at point B in the reference curve of FIG. 11. The conclusion of the process-specific rule, which called the processindependent rule checking the times of critical points, notes that the last critical point of the region occurs too late, and also notes that the region was intended to represent the etching of a polysilicon layer. The process-specific rule suggests the conclusion that the region A' to D' of the actual end point trace indicates that possibly a thin material was on the polysilicon region to be etched during the etch. This thin material on the polysilicon led to the abnormality in the end point trace from points A' to D'.

The rules detect abnormalities regardless of the size of the difference outside an acceptable range. Acceptable ranges depend on empirical knowledge of the process in the manufacturing environment. The fault ranges are provided, but the process engineer can override the values when writing the process specific rules. In cases where a problem is detected, the system can turn off the plasma etcher and report the diagnosis to a technician for corrective action.

The present invention detects and diagnoses bad etches due to errors in previous processes. One of the major causes of errors is in the deposition process, where either too much or too little material may have been deposited. An example of such an instance is shown in the actual end point trace of FIG. 13. Region 2' has an abnormally long duration as compared to Region 2 of the reference end point trace of FIG. 11. The process specific rules applied to Region 2' would note the abnormally long etch time for the region and that the material being etched in that region is polysilicon, and then suggest the conclusion that the unusually long duration indicates that the particular polysilicon layer being etched may have been deposited too thickly on the semiconductor device. Examples of other process steps which may have been incorrectly carried out prior to the monitored etch include a photolithography step, an etch step, or other processes.

The present invention interprets end point traces by combining signal to symbol transformations and rule base reasoning. The signal to symbol transformer and process independent rules apply to any plasma etch process or other process which provides suitable continuous variable data curves. If there is a problem with the etch, then a small set of process independent rules can detect the problem. A set of process specific rules diagnoses the problem by associating a cause with one or more symptoms.

As can be seen, the system of this embodiment of the present invention is modular so knowledge about the process being monitored is isolated at the process specific rule level. The other major components of the system, the signal-to-symbol transformer and the set of process independent rules, do not depend upon knowledge of the particular process (or etch process) being monitored and apply to any process (or etch process) providing a suitable continuously variable data curve. Consequently, this embodiment of the present invention can be easily, efficiently and quickly adapted for particularized use with any process providing suitable data curves.

The present invention has particular advantages when used with a plasma etch reactor. Many of these advantages stem from the complexity of the operation of the plasma etch reactor. This complexity arises from the numerous factors which affect whether the etching operation proceeds in an optimum fashion. Since the factors which affect the actual etching reaction are so numerous, the present invention which looks directly to characteristics of the reaction itself, rather than at operating parameters of the reactor vessel, and this provides a more reliable and direct means of monitoring the etch process than has heretofore been proposed. Restating the point, this embodiment of the present invention monitors process observables in contrast to process control parameters.

An example of the process control parameters which can be varied in the plasma etch reactor include varying the power, the pressure, the identity of as well as relative concentrations of the gases input to the system, the total gas flow into the reactor, and the pressure and temperature of the reactor. Some of these process control parameters are typically monitored by the hardware controls of the etch reactor.

However, numerous additional factors beyond the control parameters affect the processes inside the etch reactor. Some of these include what is referred to as chamber seasoning or the character of materials on the inside surfaces of the reactor vessel. Surface material recombinations on the interior surface of the chamber can frequently occur in an etch reactor and serve to significantly affect the progress of the etching reaction within the chamber. Another factor is the distance of the electrode from the surface of the slice. The electrode itself is also etched slightly in the operation of the reactor. After a number of etches, the distance between the surface of the slice and the electrode is increased by the etching of the electrode, and the etch reaction consequently affected. These factors which are beyond the control parameters are not readily susceptible to monitoring.

Slight variations in any one or more of the above described factors can have significant impact on whether the etching reaction proceeds in an optimum or acceptable fashion. However, due to the complexity of the interrelations of the various factors it is often difficult to predict the impact of variations in one or more of the factors on the actual etch reaction itself. In light of this complexity, the present invention provides particular advantages. The prior art hardware controls on the etcher monitor only a few of the factors affecting the rection and as pointed out above, many of the factors are not readily susceptible to monitoring. Additionally, the hardware controls only monitor factors affecting the reaction and not the reaction itself. Accordingly, in many cases, if some factor changed and detrimentally affected the etch reaction, but the hardware monitors showed a currect set of process control parameters existing (e.g., correct pressure, temperature, gas flows), the hardware monitors would not detect that the etch reaction was proceeding incorrectly. However, the present invention, by monitoring process observables (e.g., rate of production of reaction product species) much more closely monitors the actual etch reaction and is significantly more likely to detect misprocessing when it occurs than are prior systems.

Moreover, the present invention advantageously provides a system which can define and match regions of actual continuously variable curves, e.g., actual end point traces, even when those regions deviate in significant fashion from the regions of the particular reference continuously variable curve which has been defined. For example, the present invention can define regions of an actual curve which float or stretch in time. This provides a significant advantage over a curve comparison system which compares regions of curves where the regions are unchangeably defined as a function of time. Moreover, the dynamic time warping approach of the present invention to matching critical points and regions leads to improved accuracy in defining, matching and comparing regions of curves.

An embodiment of the present invention provides the advantages of detecting process related problems that arise during a typical plasma etching process, by an examination and analysis of the end point trace of the plasma etch process. The early and automatic detection of such problems, can significantly and advantageously impact slice yield by preventing further misprocessing of subsequent slices. Additionally, the invention can advantageously attribute the problems detected to predefined causes and generate a signal identifying such causes.

Additionally, the present invention can be used in a real time application to minotor the etch process as it actually proceeds and, either alone or in conjunction with other systems such as expert systems, to vary or correct etch parameters during the etch when abnormalities are detected.

Additional advantages of the present invention include elimination of strip-chart recorders from the clean room, and the ability to edit large volumes of end point traces by saving only those that show an anomalous behavior.

Another advantage is that the system functions as a process monitoring tool that complements the microprocessor-based hardware monitoring function. While the hardware monitor sets alarms and halts the processing based on hardware problems (for example, no RF power, no gas flow, incorrect pressure or other similar problems), the embodiment of the present invention can warn the operator, and eventually shut off the etcher, based on reaction process related problems.

The present invention advantageously provides a system which, by focusing on etch reaction observables, can detect errors in the etching operation which cannot be detected by monitoring equipment which simply monitors the hardware functions, i.e. gas flows, temperatures, or RF power settings of the etcher. Moreover, the present invention advantageously provides a system which comprises a backup monitoring system to the hardware monitoring apparatus of the matching reactor. Accordingly, if the hardware monitoring sensor should fail and the hardware function proceeds out of specification, the present invention would detect the problem as soon as the non-spec hardware function caused the etch reaction to vary from the reference reaction.

The present invention can be advantageously applied in numerous circumstances. For example, it can be applied in various etching operations, each of which has its own signature or reference end point trace. Each of these various end point traces may have different number of regions, with each of the regions being of different shapes. Moreover, various characteristics of each region can be defined and functions for detecting or measuring such characteristics also defined, in light of considerations unique to the particular etch or region of the etch. Additionally, the present invention can be advantageously applied on processes other than plasma etch reactions.

Although the embodiment of FIG. 1 received an analog signal from the photodiode signal generator, it will be understood that the present invention has application with either analog or digital type signals.

Figure 14:
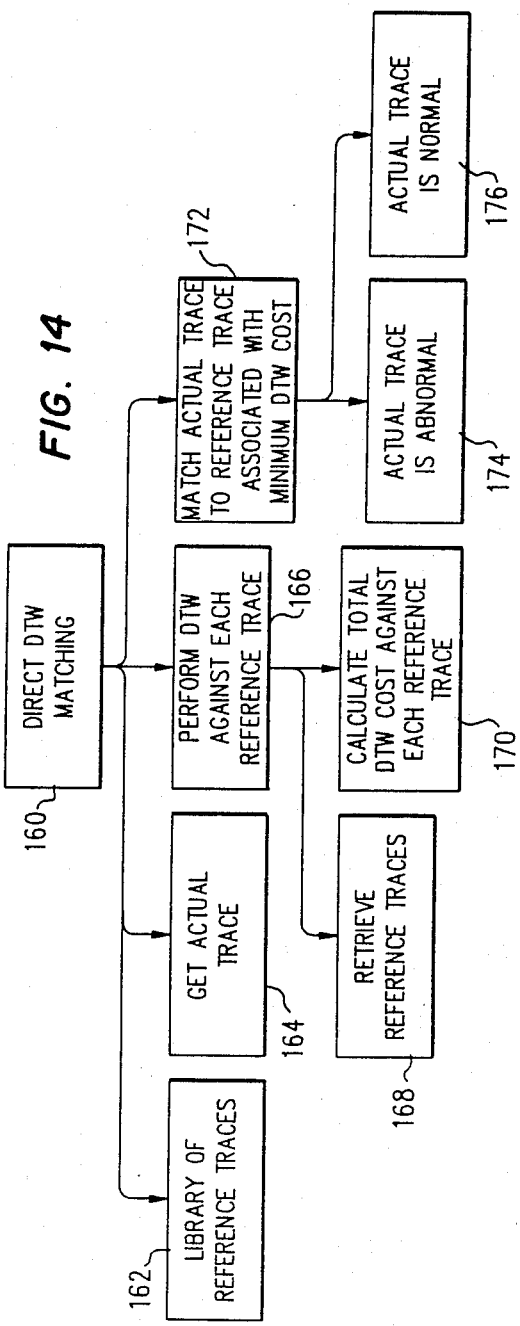
FIG. 14 illustrates a structure chart of a direct dynamic time warping method according to an alternative embodiment of the invention.

In an alternative embodiment of the invention, dynamic time warping can be used to directly compare the actual trace to each of a plurality of stored reference traces in order to determine whether the actual trace is normal, and if abnormal, the type of abnormality. FIG. 14 is a structure chart of this embodiment of the invention, termed direct dynamic time warping matching, as is shown by module 160. According to this embodiment, the computer preferably stores a library of reference traces at 162 rather than just a single optimum reference trace. Such a family of traces is shown by FIG. 15. At the bottom of FIG. 15 are shown an array of normal traces. The particular variations in shape have been simplified and exaggerated for purposes of illustration. An array of normal traces is stored in order to take into account process variations that do not result in an unacceptable end product.

FIG. 15 further includes an array of abnormal traces. These abnormal traces range in one dimension from severe abnormalities, indicated by the traces on the top of FIG. 15, to traces which are only slight abnormalities, indicated at the third row of traces. It has been determined that characteristic end point traces will be produced for each of several different types of abnormalities. These include, by way of example, having too thin a polysilicon layer, as is indicated in the first column; having too thick a nitride layer, as is shown in the second column, not etching interlevel oxide, as shown in the third column; having too thin an oxide layer on a polysilicon layer, as is shown in the fourth column; and having too thick a polysilicon layer, as is shown in the last column of traces. The normal traces on the bottom each indicate a tendency toward abnormality which is not fatal. For example, the normal trace at the lower right hand corner results from a slightly thick polysilicon layer that is still within appropriate quality control limits.

Returning to FIG. 14, direct dynamic time warping further proceeds by obtaining an actual trace from the detector at 164. They, dynamic time warping is used at 166 to match the actual trace to each of the stored reference traces. Block 166 in turn comprises the modules of retrieving the reference traces at 168, and calculating the total minimum cumulative dynamic time warping cost against each reference trace, at 170. The optimum dynamic time warping path is calculated at 170 in a manner similar to that described for FIGS. 5–9c.

At 170, the minimum cost associated with the matching of the actual trace with each reference trace is stored. Then, at block 172, the reference trace associated with the minimum dynamic time warping cost is selected for a match against the actual trace. The stored traces are previously flagged as abnormal or normal. Thus, module 172 is able to identify the actual trace as abnormal, such as at block 174, or in the alternative identifies the actual trace as within normal limits, as at 176.

The embodiment of direct dynamic time warping matching can have particular application where a process has been repeated a multitude of times, and a library of normal and abnormal traces has been stored in the computer. Since the performance of the dynamic time warping algorithm does not require a great deal of computer capacity, the match to any one of the stored normal or abnormal traces can be quickly and easily made. This direct matching technique obviates the need for process-independent rules or process-dependent rules in determining the types and degrees of abnormalities. Instead of comparing each region of the actual trace of each region of the reference trace, the traces are simply compared as a whole to yield the results.

Although the preferred embodiment has been described in detail, it should be understood that various changes, substitutions and alterations can be made therein without departing from the spirit and scope of the invention as defined by the appended claims.

What is claimed is:

1. A process monitoring apparatus comprising:
   a former for forming a variable signal reference curve corresponding to a predetermined process;
   an acquirer for acquiring actual data forming a variable signal actual curve corresponding to an actual operation of said predetermined process;
   a processor for dividing the reference data into reference regions at critical points based on characteristics of the reference data;
   a matcher for matching the critical points on the reference curve with corresponding critical points on the actual curve using a dynamic time warping function;
   a divider for dividing the actual curve into actual regions at said critical points of the actual curve;
   a comparer for comparing characteristics of at least one actualr egion with characteristics of a reference region with which the actual region has been matched; and
   a generator that generates a signal indicative of the variance of a characteristic of the actual region beyond a predefined limit from a corresponding characteristic of the reference region that has been matched with the actual region.

2. The apparatus of claim 1, wherein said matcher further comprises:
   an initiator operable to match a beginning point of the reference trace to a beginning point of the actual trace to initiate a beginning point of an optimal time warping function path, said initiator further operable to match an end point of the reference trace to an end point of the actual trace to initiate an end point of the path; and
   an optimal warping function path generator operable to generate an optimal time warping function path between the initiated beginning point and the initiated end point, said path consisting of a plurality of points correlating a compared point on the reference trace to a compared point on the actual trace.

3. The apparatus of claim 2, wherein said path generator further comprises:
   a cumulative cost calculator operable to select path segments between points on the optimal time warping function path that each represent a minimum cumulative cost for advancing from one connected point to another connected point, said calculator calculating the value of the cumulative cost of ech point on said path as a function of the dissimilarity between the reference trace up to the compared point thereon and the actual trace up to the compared point thereon.

4. The apparatus of claim 3, wherein said cumulative cost calculator is operable to calculate a minimum cumulative cost for each of a plurality of taken points in each of a plurality of successive warping function stages, said cumulative cost calculator comprising:
   an incremental cost calculator for calculating an incremental cost for a taken point;
   a cumulative cost module for storing a maximum cumulative cost associated with each of a plurality of prior points adjacent the taken piont and in a preceding stage, a plurality of candidate cumulative costs calculated, one for each prior point, as equal to the cumulative cost obtained at the prior point plus the incremental cost for the taken point; and
   a selector for selecting a minimum cumulative cost for the taken candidate point from the candidate cumulative costs.

5. The apparatus of claim 4, wherein said incremental cost calculator comprises an amplitude comparator operable to determine the dissimilarity of:
   the amplitude at the comapred reference trace point; and
   the amplitude at the compared actual trace point.

6. The apparatus of claim 5, wherein said incremental cost calculator further comprises a slope angle calculator operable to calculate the difference between:
   the change in slope angle at the compared point on the reference trace from a prior point on the reference trace; and
   the change in the slope angle at the compared point on the actual trace from a prior point on the actual trace.

7. The apparatus of claim 4, wherein said incremental cost calculator comprises a curve angle change calculator for calculating the difference between:
   the change in slope angle at the compared point on the reference trace from a prior point on the reference trace; and
   the change in slope angle at the compared point on the actual trace from a prior point on the actual trace.

8. The apparatus of claim 3, wherein said cumulative cost calculator further comprises a constrainor for constraining the taken points in each stage such that the compared point on the reference trace correlated by the candidate point is within a predetermined value in a time dimension of the point on the actual trace correlated by the candidate point.

9. Apparatus for monitoring operations in process equipment which carries out a predetermined process, comprising:
- a storer for storing a plurality of reference signal curves, each corresponding to the progress of a process conducted in said process equipment, said reference signal curves including at least one predefined normal reference signal curve corresponding to an acceptable operaiton of the process and a plurality of predefined abnormal reference signal curves, each corresponding to an unacceptable operation of the process;
- a detector for generating an actual signal curve based on an actual operation of the process;
- a warping function calculator for deriving a dynamic time warping function for each of said reference curves, each warping function resulting from a matching of the actual curve to a reference curve;
- a cost calculator for calculating a cost related to the dissimilarity between the respective reference curve and said actual curve; and
- a matcher for matching said actual curve with a selected reference curve, said reference curve associated with a minimum cost of the calculated costs.

10. The apparatus of claim 9, wherein said storer is operable to store a plurality of predefined normal reference signal curves, each corresponding to an acceptable operation of the process.

11. The apparatus of claim 9, wherein said warping function calculator comprises:
- a matcher for matching a beginning point of a considered reference curve to a beginning point of said actual curve to originate a beginning point of an optimal time warping function path, said matcher further operable to match an end point of the considered reference curve to an end point of said actual curve to originate an end point of said path; and
- a warping function path generator for generating a monotonic optimal time warping function path between said beginning point and said end point, points on said path each correlating a compared point on the considered reference curve to a compared point on said actual curve.

12. The apparatus of claim 11, wherein said warping function path generator comprises:
- a matrix storer for storing a matrix of warping function points, each warping function point correlating a selected point on a reference curve to a selected point on said actual curve;
- a generator for generating a tree of candidate path segments between stages of the warping function points, a beginning stage of said stages comprising said beginning point of said warping function path, a final stage of said matrix comprising said end point of said path, each stage comprising at least one warping function point that is adjacent to at least one warping function point in another stage, said tree generator comprising:
  - an incremental cost calculator for calculating an incremental cost for a taken warping function point;
  - a cumulative cost storer for storing a minimum cumulative cost associated with each of a plurality of candidate prodecessor points adjacent the taken point and in a preceding stage;
  - a selector for selecting a minimum cumulative costs from the stored cumulative costs associated with the candidate predecessor points, said selector selecting a predecessor point from the candidate predecessor points which is associated with said minimum; and
  - an adder for adding the incremental cost to the minimum of the cumulative costs associated with the prior points to derive a cumulative cost for the taken point.

13. The apparatus of claim 12, wherein said matrix storer further comprises a constrainer for constraining the stored warping function points in each stage such that the point on the reference curve correlated by a warping function point is within a predetermined value in a time dimension of the point on the actual curve correlated by the candidate point.

14. The apparatus of claim 12, wherein incremental cost calculator further comprises:
- a differential curve amplitude detector for calculating each incremental cost as a function of the dissimilarity of:
  - the curve amplitude at a point on the reference curve correlated by the taken warping function point; and
  - the curve amplitude at a point on the actual curve correlated by the warping function point.

15. The apparatus of claim 14, wherein said incremental cost calculator further comprises:
- a differential angle detector for calculating a factor for the incremental cost that is a function of the dissimilarity of:
  - the change in curve angle between the point on the reference curve correlated by the taken warping function point, and a prior point on the reference curve; and
  - the change in curve angle between a point on the actual curve correlated by the taken warping function point, and a prior point on the actual curve associated with the predecessor point.

16. The apparatus of claim 12, wherein said incremental cost calculator further comprises:
- differential angle detector for calculating a factor for the incremental cost that is a function of the dissimilarity of:
  - the change in curve angle between the point on the reference curve correlated by the taken warping function point, and a prior point on the reference curve; and
  - the change in curve angle between a point on the actual curve correlated by the taken warping function point and a prior point on the actual curve.

17. A method for monitoring end point traces of a plasma etch reactor comprising:
- establishing a reference end point trace for a predetermined etch process;
- dividing the reference end point trace at critical points thereof into predetermined regions;
- conducting the predetermined etch process on a semiconductor device;

obtaining an actual end point trace for the etch of the semiconductor device;

matching the critical points on the reference trace with corresponding critical points on the actual trace using a dynamic time warping function;

dividing the actual trace at the critical points thereof to define regions of the actual trace; and comparing characteristics of regions of the actual end point trace with corresponding characteristics of matched regions of the reference end point trace.

18. The method of claim 17, and further comprising:

generating a signal indicative of the variance of characteristics of the regions of the actual end point trace beyond predefined limits from corresponding characteristics of matched regions of the reference end point trace.

19. The method of claim 17, wherein said step of comparing characteristics of regions of the actual end point trace with corresponding characteristics of matched regions of the reference end point trace comprise applying a set of rules to at least one of the regions of the actual end point trace.

20. The method of claim 19, wherein the set of rules comprises a set of process-independent rules and a set of process-specific rules.

21. The method of claim 20, wherein the application of the set of process-independent rules comprises comparing, between a region of the actual end point trace and a matched region of the reference end point trace, at least one of:

the value;

the slope; and the time of at least one predefined point in the respective regions.

22. The method of claim 17, further comprising:

determining whether a deviation between a characteristic of the actual end point trace and a corresponding characteristic of the reference end point trace exceeds a predefined value;

attributing such deviation to at least one predefined cause;

generating a signal identifying said at least one predefined cause to which the deviation has been attributed.

23. The method of claim 17, wherein said step of matching the critical points comprises the further steps of:

matching a beginning point of the reference trace to a beginning point of the actual trace to originate a beginning poit of an optimal time warping function path;

matching an end point of the reference trace to an end point of the actual trace to originate an end point of the path;

generating an optimal time warping function path between the beginning point and the end piont thereof, points on the path each correlating a compared point on the reference trace to a compared point on the actual trace; and correlating the critical points on the reference trace to critical points on the actual trace using the optimum time warping function path.

24. The method of claim 23, wherein said step of generating the optimal time warping function path comprises the further steps of:

using a minimum cumulative cost function in selecting path segments between points on the optimal time warping function path, the value of the cumulative cost function related to the dissimilarity between the reference trace up to the compared point thereon and the actual trace up to the compared point thereon.

25. The method of claim 24, and further including the step of calculating a minimum cumulative cost for each of a plurality of warping function points in each of a plurality of successive warping function stages, said step of calculating including, for any taken warping function point, the further steps of:

calculating an incremental cost for the taken point;

storing a cumulative cost associated with each of a plurality of candidate predecessor points adjacent the taken point and in a preceding stage;

selecting a minimum of the stored cumulative costs for the candidate predecessor points; and adding the minimum stored cumulative cost to the incremental cost to derive a minimum cumulative cost for the taken point.

26. The method of claim 25, wherein said step of generating the optimal time warping function path further includes the steps of:

for each taken point constructing a candidate path segment between the predecessor point and the taken point; and back-tracing an optimal time warping function path from the end point thereof to the beginning point thereof using connected candidate path segments.

27. The method of claim 26, wherein said incremental cost is calculated as a function of the dissimilarity of:

the amplitude at the compared reference trace point; and the amplitude at the compared actual trace point.

28. The method of claim 27, wherein said incremental cost is further a function of the dissimilarity of:

the change in slope angle at the compared point on the reference trace from a prior point on the reference trace; and the change in the slope angle at the compared point on the actual trce from a prior point on the actual trace.

29. The method of claim 26, and further including the steps of calculating the incremental cost as a function of the difference between:

the change in slope angle at the compared point on the reference trace from a prior point on the reference trace; and the change in slope angle at the compared point on the actual trce from a prior point on the actual trace.

30. The method of claim 25, and further including the step of:

constraining the taken warping function points such that a compared point on the reference trace first pointer in the pair of pointers is within a predetermined value in time from the compared point on the actual trace.

31. A method for monitoring operations in process equipment which carries out a predetermined process, comprising:

monitoring a process by a detector that provides a variable actual signal curve corresponding to the progress of the process;

defining a variable reference signal curve corresponding to a predefined acceptable operation of the predetermined process;

dividing the reference curve into regions on the basis of shared characteristics of the points on the curve within the region, said step of dividing performed at a plurality of critical points on the reference curve;

matching the critical points on the reference curve with corresponding critical points on the actual curve using a dynamic time warping function;

dividing the actual curve into regions at the critical points thereof; and comparing characteristics of at least one of the regions of the actual curve with the characteristics of a matched region in the reference curve.

32. The method of claim 31, wherein said step of matching the critical points comprises the further steps of:

matching a beginning point of the reference curve to a beginning point of the actual curve to formulate a beginning point of an optimal time warping function path;

matching an end point of the reference curve to an end point of the actual curve to originate an end point of the optimal time warping function path;

generating a monotonic optimal time warping function path between the beginning point and the end point thereof, points on the path each correlating a point on the reference curve to a point on the actual curve; and correlating the critical points on the reference curve to critical points on the actual curve using the optimum time warping function path.

33. The method of claim 32, wherein said step of generating the monotonic optimal time warping function path comprises the further step of using a minimum cumulative cost function in determining path segments between points on the optimal time warping function path, the value of the cumulative cost function at any point on the path being related to the dissimilarity between the reference curve up to a correlated point thereon and the actual curve up to a correlated point thereon.

34. The method of claim 33, and further including the step of calculating a minimum cumulative cost for each of a plurality of taken warping function points in each of a plurality of successive warping function stages, said step of calculating including, for any taken warping function point, the further steps of:

calculating an incremental cost for the taken point;

storing a cumulative cost associated with each of a plurality of candidate predecessor points adjacent the taken point and in a preceding stage;

selecting a minimum of the cumulative costs associated with the candidate predecessor points, a predecessor point associated with the minimum being chosen from the candidate predecessor points; and adding the incremental cost of the taken point to the cumulative cost of the predecessor point to derive the minimum cumulative cost for the taken point.

35. The method of claim 34, wherein said step of generating a monotonic optimal time warping function path includes the steps of:

for each taken warping function point, constructing a candidate path segment from the taken point to the predecessor point therefor; and back-tracing a monotonic optimal warping path from the end point thereof to the beginning point thereof using connected candidate path segments.

36. The method of claim 35, and further including the step of calculating the incremental cost for a taken point as a function of the dissimilarity of:

the amplitude at the correlated point on the reference curve; and the change in amplitude at the correlated point on the actual curve.

37. The method of claim 36, and further including the step of calculating the incremental cost as a further function of the dissimilarity of:

the change in curve angle between a correlated point on the reference curve and a prior point on the reference curve; and the change in curve angle between a correlated point on the actual curve and a prior point on the actual curve.

38. The method of claim 35, and further including the step of calculating the incremental cost for the taken point as a function of the dissimilarity of:

the change in curve angle between a correlated point on the refrence curve and a prior point on the reference curve; and the change in curve angle between a correlated poit on the actual curve and a prior point on the actual curve.

39. The method of claim 35, and further including the step of:

constraining the taken warping function points in each stage such that the point on the reference curve correlated by the taken warping function point is within a predetermined value in a time dimension of the point on the actual curve correlated by the taken point.

40. The method of claim 31, wherein said critical points are identified on the basis of changes in slope angle of the reference curve.

41. The method of claim 31, wherein said predetermined process comprises a plasma etch.

42. A method for monitoring operations in process equipment which carries out a predetermined process, comprising the steps of:

storing a plurality of reference signal curves each corresponding to the progress of a process, the reference signal curves including at least one predefined normal reference signal curve corresponding to an acceptable operation of the process and a plurality of predefined abnormal reference signal curves, each corresponding to an unacceptable operation of the process;

generating an actual signal curve by a detector, the actual curve corresponding to an actual operation of the process;

deriving a dynamic time warping function for each of the reference curves, each warping function resulting from a matching of the actual curve to a reference curve;

for each derived warping function, determining a cost related to the dissimilarity between the respective reference curve and the actual curve;

finding a minimum cost function of the determined cost functions; and declaring a match between the actual curve and the reference curve associated with the minimum cost function.

43. The method of claim 42, wherein said step of deriving a dynamic time warping function for each of the reference curves comprises, for each reference curve, the steps of:

matching a beginning point of the reference curve to a beginning point of the actual curve to originate a beginning point of an optimal time warping function path;

matching an end point of the reference curve to an end point of the actual curve to originate an end point of the path; and generating a monotonic optimal time warping function path between the beginning point and the end point thereof, points on the path each correlating a compared point on the reference curve to a compared point on the actual curve.

44. The method of claim 43, wherein said step of generating a monotonic optimal time warping function path comprises the further steps of:

defining a matrix of warping function points, each point correlating a compared point on the reference curve to a compared point on the actual curve;

generating a tree of candidate path segments, between warping function points in successive stages of the matrix, each warping function point in one stage adjacent at least one warping function point in a next preceding stage, a first stage containing the beginning point of the path, a last stage containing the end point of the path said step of generating the tree comprising, for each of a plurality of taken warping function points, the further steps of:

calculating an incremental cost for the taken warping function point;

storing a cumulative cost associated with each of a plurality of candidate predecessor points adjacent the taken poit and in a next preceding stage;

finding a minimum of the cumulative costs associated with the candidate predecessor points;

selecting a predecessor point from the candidate predecessor points, the predecessor point associated with the minimum of the last said cumulative costs;

constructing a candidate path segment from the taken point to the predecessor point therefor; and back-tracing an optimum, monotonic warping function path from the end point thereof to the beginning point thereof using connected path segments.

45. The method of claim 44, and further including the step of calculating the incremental cost as a further function of the dissimilarity of:

the change in curve angle between a correlated point on the reference curve and a next preceding point on the reference curve; and the change in curve angle between a correlated point on the actual curve and a next preceding point on the actual curve.

46. The method of claim 45, and further including the step of calculating the incremental cost as a function of the dissimilarity of:

the amplitude at a correlated point on the reference curve; and the amplitude at a correlated point on the actual curve.

47. The method of claim 44, and further including the step of calculating the incremental cost as a function of the dissimilarity of:

the amplitude at a correlated point on the reference curve; and the amplitude at a correlated point on the actual curve.

48. The method of claim 44, and further including the steps of:

constraining the taken points in each stage of the warping function matrix to those candidate points that match a point on the actual curve at a selected time to a point on the reference curve within a predetermined period from the selected time.

49. An apparatus for monitoring a plasma etch process on a semiconductor device in a plasma etch reactor, said apparatus comprising:

a former for forming at least one variable signal reference curve from reference data corresponding to said plasma etch process;

an acquirer for acquiring actual data forming a variable signal actual curve corresponding to an actual operation of said plasma etch process; and a warping function calculator for deriving a dynamic time warping function resulting from comparing said actual curve to said at least one reference curve.

50. The apparatus of claim 49 in which said reference curve indicates an intended operation for said predetermined process.

51. The apparatus of claim 49 in which said warping function calculator includes an initiator for matching a beginning point of said at least one reference curve to a beginning point of said actual curve to originate a beginning point of an optimal time warping path, said initiator further operable to match an end point of the considered reference curve to an end point of said actual curve to originate an end point of said path, and a warping function path generator for generating a monotonic optimal time warping function path between said beginning point and said end point, points on said path each correlating a compared point on said at least one reference curve to a compared point on said actual curve.

52. The apparatus of claim 49 further including a processor for dividing the reference data into reference regions at critical points based on critical characteristics of the reference data, said warping function calculator matching critical points on the reference curve with corresponding critical points on the actual curve using said dynamic time warping function, and further including a divider for dividing the actual curve into actual regions at said critical points of the actual curve, a comparer for comparing characteristics of at least one actual region with characteristics of a reference region with which the actual region has been matched, and a generator that generates a signal indicative of the variance of a characteristic of the actual region beyond a defined limit from a corresponding characteristic of the reference region that has been matched with the actual region.

53. The apparatus of claim 49 in which said former forms plural reference curves including at least one reference curve corresponding to an acceptable operation of the process and a plurality of predetermined reference curves each corresponding to an unacceptable operation of the process, and said calculator derives a dynamic time warping function for each of said reference curves resulting from a matching of the actual curve to a reference curve.

54. The apparatus of claim 53 including a cost calculator or calculating a cost related to the dissimilarity between the respective reference curve and said actual curve; and a matcher for matching said actual curve with a selected reference curve, said reference curve associated with a minimum cost of the calculated costs.

55. The apparatus of claims 1 or 9 in which said predetermined process is a plasma etch process conducted in a plasma etch reactor.

56. The apparatus of claim 1 in which said reference curve indicates an intended operation for said predetermined process.

57. A method of monitoring a plasma etch process on a semiconductor device in a plasma etch reactor, said method comprising:
    defining at least one variable signal reference curve from reference data corresponding to said plasma etch process;
    obtaining actual data forming a variable signal actual curve corresponding to an actual etching of said semiconductor device by said plasma etch process; and
    deriving a dynamic time warping function resulting from comparing said actual curve to said at least one reference curve.

58. The method of claim 57 in which said defining includes defining at least one reference curve indicating an intended operation for said predetermined process.

59. The method of claim 57 in which said deriving includes matching a beginning point of said at least one reference curve to a beginning point of said actual curve to originate a beginning point of an optimal time warping path, and further matching an an end point of the considered reference curve to an end point of said actual curve to originate an end point of said path, and said deriving further including generating a monotonic optimal time warping function path between said beginning point and said end point, points on said path each correlating a compared point on said at least one reference curve to a compared point on said actual curve.

60. The method of claim 57 further including dividing the reference data into reference regions at critical points based on critical characteristics of the reference data, said deriving including matching ctitical points on the reference curve with corresponding critical points on the actual curve using said dynamic time warping function, and further including dividing the actual curve into actual regions at said critical points of the actual curve, comparing characteristics of at least one actual region with characteristics of a reference region with which the actual region has been matched, and generating a signal indicative of the variance of a characteristic of the actual region beyond a defined limit from a corresponding characteristic of the reference region that has been matched with the actual region.

61. The method of claim 57 in which said defining defines plural reference curves including at least one reference curve corresponding to an acceptable operation of the process and a plurality of predetermined reference curves each corresponding to an unacceptable operation of the process, and said deriving derives a dynamic time warping function for each of said reference curves resulting from a matching of the actual curve to a reference curve.

62. The method of claim 61 including calculating a cost related to the dissimilarity between the respective reference curve and said actual curve, and matching said actual curve with a selected reference curve, said reference curve associated with a minimum cost of the calculated costs.

63. The method of claim 17 in which said establishing a reference curve includes establishing a reference curve indicating an intended operation for said predetermined process.

64. The method of claim 31 in which said defining a reference curve includes defining a reference curve indicating an intended operation for said predetermined process.

65. The method of claim 42 in which said predetermined process is a plasma etch process conducted in a plasma etch reactor.

* * * * *